US010008408B2

(12) United States Patent
Ryan et al.

(10) Patent No.: US 10,008,408 B2
(45) Date of Patent: Jun. 26, 2018

(54) DEVICES AND METHODS OF FORMING ASYMMETRIC LINE/SPACE WITH BARRIERLESS METALLIZATION

(71) Applicant: GLOBALFOUNDRIES Inc., Grand Cayman (KY)

(72) Inventors: Errol Todd Ryan, Clifton Park, NY (US); Nicholas Vincent Licausi, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days. days.

(21) Appl. No.: 15/182,794

(22) Filed: Jun. 15, 2016

(65) Prior Publication Data

US 2017/0365509 A1 Dec. 21, 2017

(51) Int. Cl.
*H01L 21/02* (2006.01)
*H01L 21/768* (2006.01)
*H01L 21/311* (2006.01)

(52) U.S. Cl.
CPC .. *H01L 21/76814* (2013.01); *H01L 21/02126* (2013.01); *H01L 21/31111* (2013.01); *H01L 21/76825* (2013.01); *H01L 21/76826* (2013.01)

(58) Field of Classification Search
CPC ......... H01L 23/52; H01L 21/02; H01L 21/76; H01L 21/768; H01L 21/311; H01L 21/76814; H01L 21/02126; H01L 21/76825; H01L 21/31111
USPC ...................................................... 257/773
See application file for complete search history.

(56) References Cited

U.S. PATENT DOCUMENTS

| 6,594,540 B1* | 7/2003 | Parikh ............... H01L 21/76811 257/E21.579 |
| 2005/0079682 A1* | 4/2005 | Lee ................... H01L 21/76232 438/400 |
| 2008/0042283 A1* | 2/2008 | Purushothaman H01L 21/76825 257/754 |
| 2009/0072301 A1* | 3/2009 | Bhalla ................... H01L 29/407 257/328 |

(Continued)

OTHER PUBLICATIONS

E. Todd Ryan et al. "Effect of material properties on integration damage in organosilicate glass films", J. Mater. Res., vol. 16, No. 12, Dec. 2001.

*Primary Examiner* — Chuong A Luu
(74) *Attorney, Agent, or Firm* — Heslin Rothenberg Farley & Mesiti P.C.; Nathan B. Davis

(57) ABSTRACT

Devices and methods of fabricating integrated circuit devices for forming assymetric line/space with barrierless metallization are provided. One method includes, for instance: obtaining an intermediate semiconductor device having a substrate, a dielectric matrix, and a hardmask, the dielectric matrix including a set of trenches etched into the dielectric matrix and a set of dielectric fins comprising the dielectric matrix, wherein the set of trenches and the set of dielectric fins are of equal width; damaging an inner surface of each trench of the set of trenches; etching the damaged material of the trenches removing the damaged material of the dielectric matrix; removing the hardmask; and metallizing the trenches by depositing a metal directly on the dielectric matrix with no barrier between the metal and the dielectric matrix after the etching. Also disclosed is an intermediate device formed by the method.

18 Claims, 5 Drawing Sheets

(56) References Cited

U.S. PATENT DOCUMENTS

| | | | |
|---|---|---|---|
| 2011/0254139 A1* | 10/2011 | Choi | H01L 21/31053 |
| | | | 257/632 |
| 2015/0111396 A1* | 4/2015 | Chan | C23C 16/045 |
| | | | 438/798 |
| 2016/0049392 A1* | 2/2016 | Bhalla | H01L 27/0629 |
| | | | 257/401 |
| 2017/0125574 A1* | 5/2017 | Chowdhury, Sr. | H01L 29/7787 |

\* cited by examiner

DEVICES AND METHODS OF FORMING ASYMMETRIC LINE/SPACE WITH BARRIERLESS METALLIZATION

FIELD OF THE INVENTION

The present invention relates to semiconductor devices and methods of fabricating semiconductor devices, and more particularly, to devices and methods of forming asymmetric line/space conductors with barrierless or alternative barrier metallization.

BACKGROUND OF THE INVENTION

With the continually increasing demand for smaller circuit structures and faster device performance, copper line resistivity has continued to climb, degrading the interconnect performance of the nodes. Beyond 7 nm nodes, the increased resistivity of the lines in the nodes requires the use of more and more asymmetric line/space (L/S), with a wider line than the space. However, directly printing asymmetric line/space with wider line critical dimension (CD) has proven problematic. For instance, the pitch required for 7 nm nodes is in the range of 36 to 48 nanometers (nm), while for 5 nm it is 26-32 nm, and for 3 nm the required pitch could be below 24 nm. Conventional self-aligned via (SAV) patterning techniques become a challenge at approximately 48 nm, even for symmetric L/S, and thus directly printing wide line L/S requires integration scheme changes. Additionally, conventional pillar blocks can be used to print down to approximately 30 nm if printing symmetric L/S, but asymmetric L/S below 30 nm would likely require alternative integration techniques, making printing and cutting asymmetric L/S difficult at such small sizes.

A significant problem with direct printing asymmetric L/S is the block placement for patterning. In a conventional Self Aligned Double Patterning (SADP) integration scheme, the block must land on two spacers. Thus, the block placement error margin is very low. With symmetric L/S, the edge placement error is roughly one quarter of the pitch (e.g. 7 nm for 28 nm pitch). In an asymmetric L/S with wider spacer, rather than wider line, the block placement error tolerance is relaxed, as the spacers have widened. However, as the spacer narrows and the line widens, the margin for error quickly decreases, as landing a block on two very narrow spacers requires a high level of accuracy which is not currently possible.

Previous asymmetric L/S nodes utilized patterning of symmetric L/S nodes, and relied upon the deposition of a barrier material via physical vapor deposition (PVD) to widen the line as the barrier was deposited prior to Cu fill. However, again, as the size of the lines get smaller and the pitch get smaller, PVD becomes ineffective for applying a barrier layer in the lines. Instead, chemical vapor deposition (CVD) or atomic layer deposition (ALD) are required for applying a barrier layer. Neither CVD nor ALD widen the trench upon deposition as PVD does. Therefore, widening the line to create an asymmetric L/S for the sub-7 nm nodes is not possible with previous techniques.

It is desirable to develop methods of widening the lines in nodes of such a small pitch without requiring direct printing of an asymmetric L/S.

BRIEF SUMMARY

The shortcomings of the prior art are overcome and additional advantages are provided through the provisions, in one aspect, a method that includes, for instance: obtaining an intermediate semiconductor device having a substrate, a dielectric matrix, and a hardmask, the dielectric matrix including a set of trenches etched into the dielectric matrix and a set of dielectric fins including the dielectric matrix, wherein the set of trenches and the set of dielectric fins are of equal width; intentionally damaging an inner surface of each trench of the set of trenches; etching the damaged material of the trenches removing the damaged material of the dielectric matrix; removing the hardmask; and metallizing the trenches by depositing a metal in the trenches directly on the dielectric matrix with no barrier between the metal and the dielectric matrix after the etching. Also disclosed is an intermediate device formed by the method.

In another aspect, an intermediate device is provided which includes, for instance: a substrate; a dielectric matrix; a set of dielectric fins; and a set of metallized trenches between the dielectric fins, the metallized trenches being wider than the dielectric fins, wherein the metallized trenches include a metal directly contacting the dielectric matrix without a liner or a barrier.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain integrated circuits, which provide advantages over the above noted, existing semiconductor devices and fabrication processes. Advantageously, the integrated circuit device fabrication processes disclosed herein provide for semiconductor devices with an asymmetric line/space with barrierless metallization.

Figure 1:
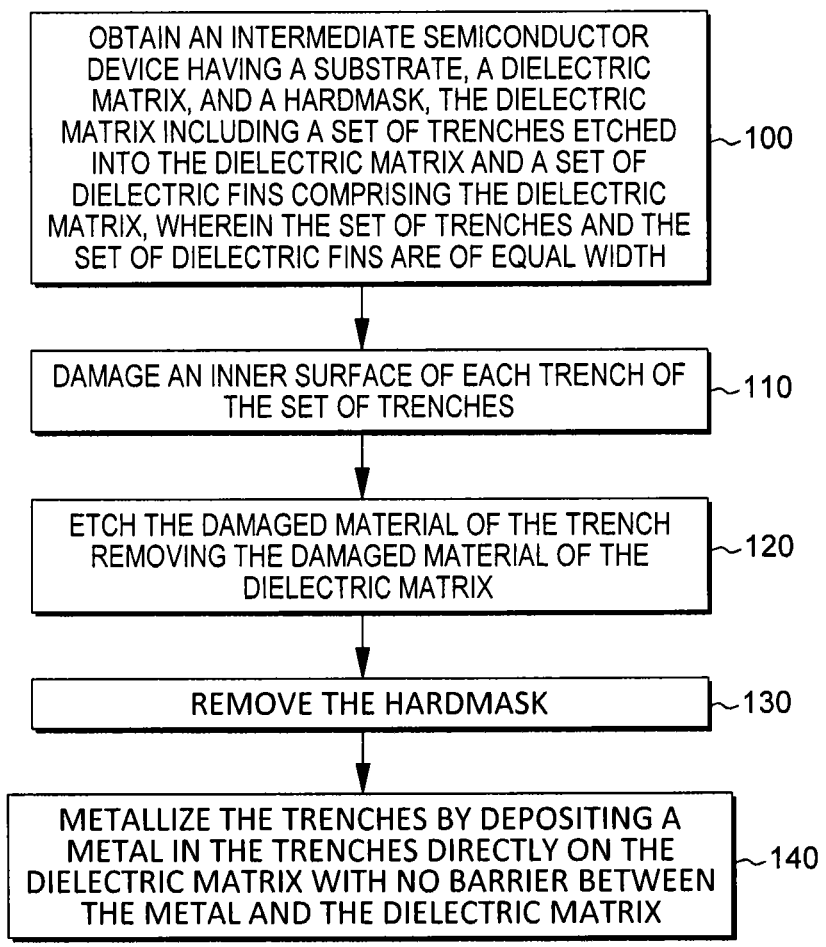
FIG. 1 depicts one embodiment of a method for forming an intermediate semiconductor structure, in accordance with one or more aspects of the present invention.

In one aspect, in one embodiment, as shown in FIG. 1, an integrated circuit device formation process in accordance with one or more aspects of the present invention may include, for instance: obtaining an intermediate semiconductor device having a substrate, a dielectric matrix, and a hardmask, the dielectric matrix including a set of trenches etched into the dielectric matrix and a set of dielectric fins including the dielectric matrix, wherein the set of trenches and the set of dielectric fins are of equal width 100; damaging an inner surface of each trench of the set of trenches 110; etching the damaged material of the trench, removing the damaged material of the dielectric matrix 120; removing the hardmask 130; and metallizing the trenches by depositing a metal in the trenches directly on the dielectric matrix with no barrier between the metal and the dielectric matrix 140.

FIGS. 2-8 depict, by way of example only, one detailed embodiment of a portion of a semiconductor device formation process and a portion of an intermediate semiconductor structure, in accordance with one or more aspects of the present invention. Note that these figures are not drawn to scale in order to facilitate understanding of the invention, and that the same reference numerals used throughout different figures designate the same or similar elements.

Figure 2:
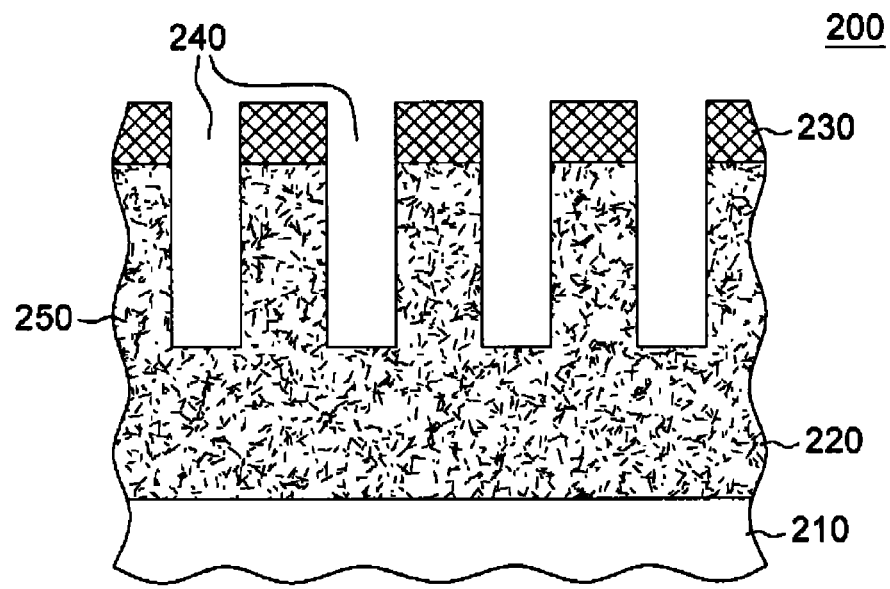
FIG. 2 depicts a cross-sectional elevation view of one embodiment of an intermediate semiconductor structure having a substrate, and a hardmask, the dielectric matrix including a set of trenches etched into the dielectric matrix and a set of dielectric fins including the dielectric matrix, in accordance with one or more aspects of the present invention.

FIG. 2 shows a portion of an intermediate semiconductor device generally denoted 200, depicted at an intermediate semiconductor fabrication stage. The device 200 may have been processed through initial device processing steps in accordance with the design of the device 200 being fabricated. For example, the device 200 may include, for instance, a substrate 210 with a dielectric matrix 220, which may include a dielectric material or any low-k material, included but not limited to SiCOH and pSiCOH, disposed on the substrate 210. The substrate 210 may be any suitable material, for example, silicon. Additionally, hardmask 230 may be deposited on the dielectric matrix 220. Dielectric matrix 220 may include a set of trenches 240 which have been etched into the dielectric matrix 220 and a set of dielectric fins 250, the dielectric fins 250 including the same material as dielectric matrix 220, being the material left after etching trenches 240. As illustrated in FIG. 2, the set of trenches 240 and the set of dielectric fins 250 may be of equal width, which allows for aligning cut masks and via masks to the symmetrically printed L/S of the intermediate semiconductor device 200 at sizes equal to or smaller than those required for a 7 nm node. The set of trenches 240 include voids between the set of dielectric fins 250. After filling the trenches 240, or metallizing them, as described below, the metallized trenches will become the lines of the node, and the remaining portion of dielectric fins 250 will become the "space" of the L/S of the node as used above. Accordingly, the set of trenches 240 should be understood to be interchangeable with lines of the L/S and the set of dielectric fins 250 should be understood to be interchangeable with the space of the L/S node.

In another embodiment (not shown), the substrate of device 200 may be, for example, a silicon on insulator (SOI) substrate (not shown). For example, the SOI substrate may include an isolation layer (not shown), which may be a local buried oxide region (BOX) or any suitable material for electrically isolating transistors, aligned with the gate structure. In some embodiments, the device is a portion of a back end of line (BEOL) portion of an integrated circuit (IC).

As depicted in FIG. 2, using lithography and etching processes, the trenches 240 may have been etched in the dielectric matrix 220 to define the L/S width of the device 200. The etching may be performed by any suitable etching process, for example, a directional reactive ion etching (ME).

Figure 3:
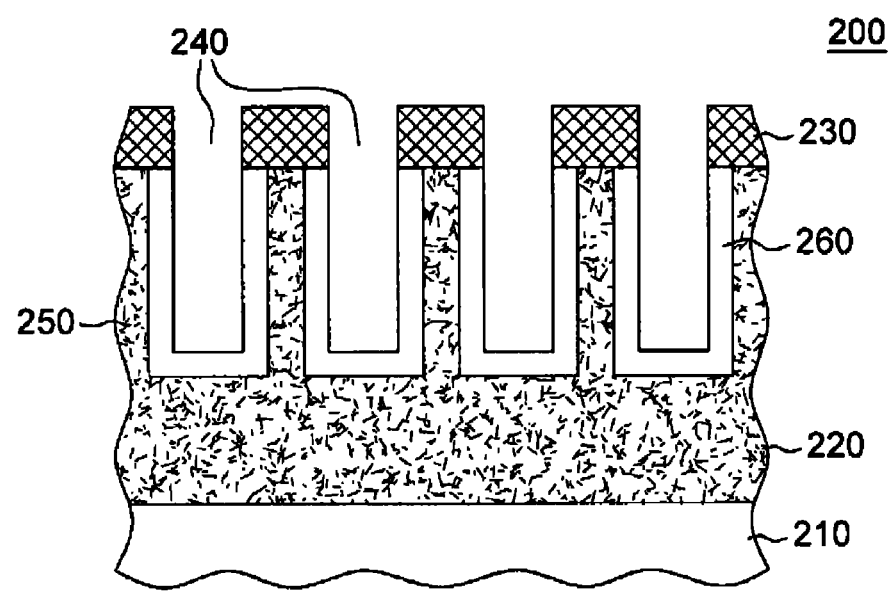
FIG. 3 depicts the structure of FIG. 2 after damaging an inner surface of each trench, in accordance with one or more aspects of the present invention.

As depicted in FIG. 3, an inner surface of each of the trenches 240 may be damaged, resulting in damaged material 260 lining each trench 240. According to embodiments, the damage may be controlled to selectively damage the internal surface of the trenches 240, allowing for a controlled depth of damage, allowing for control over the amount and depth of damaged material 260. For instance, the damage can include exposure to plasma, exposure to ozone, or exposure to ultraviolet (UV) photolysis of a material. In embodiments where the hardmask 230 covers an entirety of a top surface of each dielectric fin 250, the hardmask 230 can protect the top of dielectric fins 250 from damage from the process.

In some embodiments, damaging the inner surface of the trenches may include exposing the trenches 240 to a plasma. The plasma exposure may include remote plasma exposure or direct plasma exposure for approximately 2 second to approximately 60 seconds, depending on the depth of damage desired for line, or trench, widening. The plasma may include, but is not limited to, plasma containing $NH_3$, $O_2$, and $CO_2$. It should be understood that any material can be included in the plasma that is a reactive plasma capable of damaging a dielectric low-k film. The plasma damages the dielectric matrix 220 by removing the carbon component to a certain degree from the dielectric matrix 220, resulting in a carbon depleted damaged area 260 (FIG. 3). Damage by plasma is a diffusion limited process, allowing for the damage to deepen the longer the exposure time, giving a precise control over the depth of the damage.

Similarly, in some embodiments exposure to ozone ($O_3$) for approximately 2 second to approximately 60 seconds can result in a similar damage to the inner surface of trenches 240. In other embodiments, the damage may be achieved by exposure the UV photolysis of a material, for instance $NH_3$, $O_2$, and $CO_2$. This can be achieved by exposure of the inner surface of trenches 240 to the material and a broadband UV source simultaneously. The depth of the damage can be controlled by exposure time of UV, for instance between approximately 2 seconds and approximately 60 seconds. The damage depth is determined by the diffusion depth of the material determined by the length of exposure time, and by the limits of UV penetration through a layer. The photolysis of the material results in radicals being formed, which diffuse into the trenches 240, depleting the carbon in the damaged area 260 (FIG. 3).

Although examples of methods of damaging the inner surface of trenches 240 are given above, these are not meant to be limiting. For instance, it should be understood that the formation of radicals or any other reactive species by any method now known or later developed, can deplete the carbon and result in damaged area 260 by diffusion via exposure to the radicals.

Figure 4:
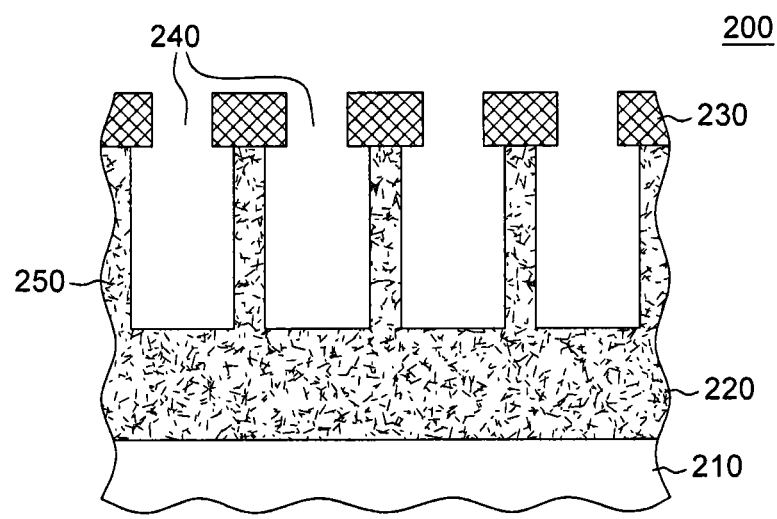
FIG. 4 depicts the structure of FIG. 3 after etching the damaged material of the trenches removing the damaged material, in accordance with one or more aspects of the present invention.

As depicted in FIG. 4, following carbon depletion, and thus damage, to damaged area 260 (FIG. 3) of trenches 240 to a desired depth, the damaged material may be etched away, effectively widening trenches 240 via removal of a portion of the material of dielectric fins 250, and thus the dielectric matrix 220 material. The removal of material may include etching, for instance a wet etch of the damaged area 260 (FIG. 3). This may be achieved by exposure to a dilute hydrofluoric acid, for instance. In some embodiments, multiple etchings may occur in order to widen trenches 240. However, in some embodiments, only a single exposure to the etch material is applied, as the amount of material removed after the first etch is significantly reduced.

Figure 5:
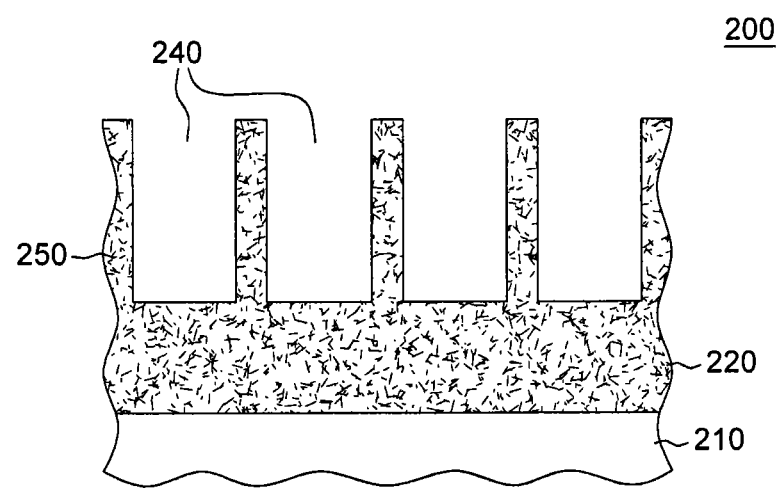
FIG. 5 depicts the structure of FIG. 4 after removing the hardmask, in accordance with one or more aspects of the present invention.

As depicted in FIG. 5, the hardmask 230 (FIG. 4) is removed. While illustrated as a separate step, it should be understood that hardmask 230 may be removed simultaneously with the removal of damaged area 260 (FIG. 3), via the same etching technique. If removed separately, the same etching chemistry or a different etching chemistry may be utilized to remove hardmask 230.

Figure 6:
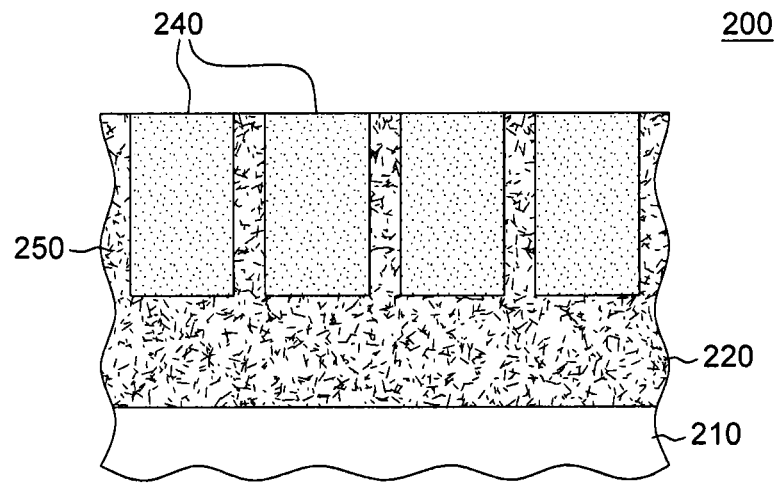
FIG. 6 depicts the structure of FIG. 5 after metallizing the trenches by depositing a metal directly on the dielectric and planarizing the surface of the structure, in accordance with one or more aspects of the present invention.

As depicted in FIG. 6, widened trenches 240 can be metallized by depositing a metal in the trenches 240, directly on the dielectric matrix 220 forming dielectric fins 250 and below trenches 240, with no barrier layer between the metal of trenches 240 and the dielectric matrix 220 or dielectric fins 250 after the etching. As an advantage of the widened lines or trenches, the metal used can be any metal that advantageously does not require the use of a barrier layer. For instance, copper (Cu), cobalt (Co), or ruthenium (Ru) may be used, or a number of noble metals that may have decreased resistivity at smaller sizes, but that do not necessarily require a barrier layer when utilized as lines in a semiconductor device 200.

Figure 7:
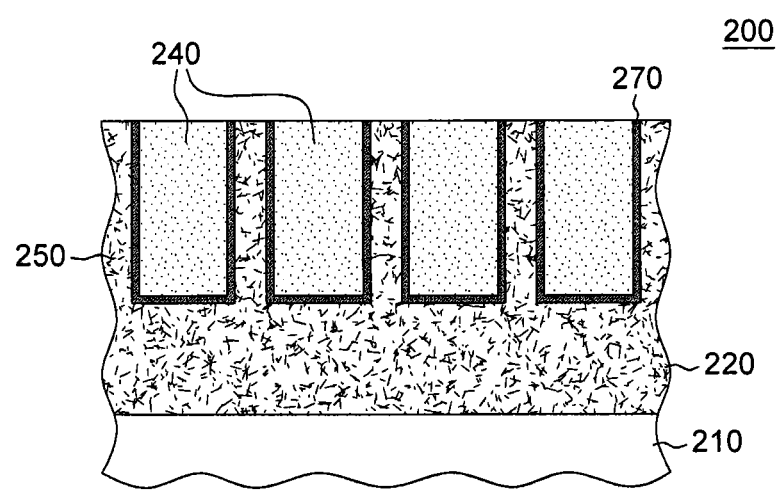
FIG. 7 depicts an alternative to structure of FIG. 6, including a barrier layer being deposited prior to the metallizing, in accordance with one or more aspects of the present invention.

As depicted in FIG. 7, although methods of certain embodiments negate the need for a barrier and/or liner layer, a barrier and/or liner layer 270 may be deposited in trenches 240 prior to metallization. In some embodiments, a barrier and/or liner layer 270 may be desired for other properties, so while not necessary with the widened lines, it may be utilized. The barrier and/or liner layer can include any tantalum (Ta), manganese (Mn), ruthenium (Ru), Cobalt (Co) or titanium (Ti) containing material, including nitride materials, such as TaN.

Either with or without the barrier layer 270 (FIG. 6), following metallization, the intermediate semiconductor device 200 may be planarized along a top surface of the structure, for instance using chemical mechanical polishing (CMP) techniques to provide a smooth surface for further processing in any desired end device, e.g., an IC device.

Figure 8:
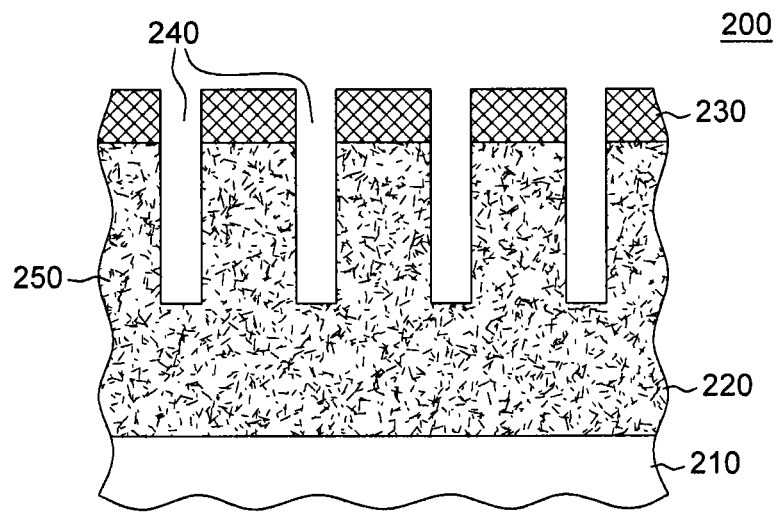
FIG. 8 depicts a cross-sectional elevation view of one embodiment of an intermediate semiconductor structure having a substrate, and a hardmask, the dielectric matrix including a set of trenches etched into the dielectric matrix and a set of dielectric fins including the dielectric matrix, the dielectric fins being wider than the trenches, in accordance with one or more aspects of the present invention.
Figure 9:
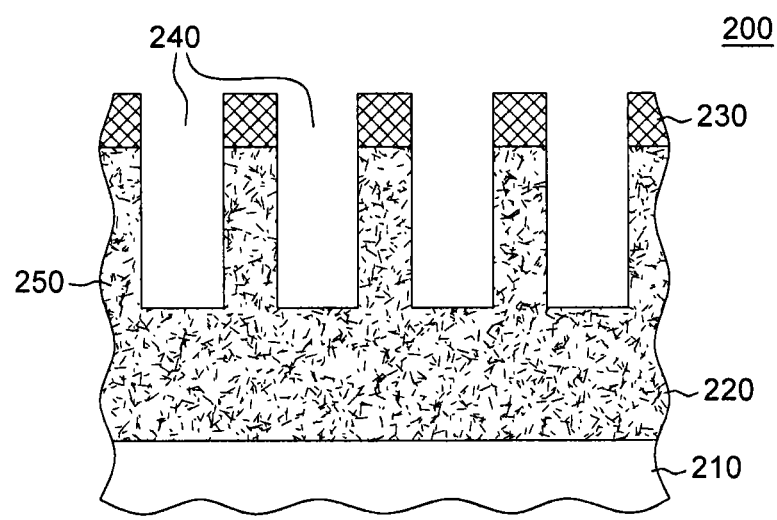
FIG. 9 depicts a cross-sectional elevation view of one embodiment of an intermediate semiconductor structure having a substrate, and a hardmask, the dielectric matrix including a set of trenches etched into the dielectric matrix and a set of dielectric fins including the dielectric matrix, the trenches being wider than the dielectric fins, in accordance with one or more aspects of the present invention.

While described in reference to equal widths of dielectric fins 250 and trenches 240, it should be understood that this method can be applied to existing assymetric arrangements as well. As seen in FIG. 8, in an alternative to FIG. 2, dielectric fins 250 may be wider than trenches 240 before damaging the inner surface of trenches 240. Additionally, as seen in FIG. 9, the trenches 240 may be wider than the dielectric fins 250 prior to damaging. Methods disclosed herein may be applied equally to symmetric and asymmetric arrangements of dielectric fins and trenches.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   obtaining an intermediate semiconductor device having a substrate, a dielectric matrix, and a hardmask, the dielectric matrix including a set of trenches etched into the dielectric matrix and a set of dielectric fins comprising the dielectric matrix, wherein the set of trenches and the set of dielectric fins are of equal width;
   damaging an inner surface of each trench of the set of trenches;

etching the damaged material of the trenches removing the damaged material of the dielectric matrix, widening each trench to a second width wider than the width of the set of dielectric fins;

removing the hardmask; and metallizing the trenches by depositing a metal in the trenches directly on the dielectric matrix with no barrier between the metal and the dielectric matrix after the etching.

2. The method of claim 1, further comprising:

planarizing a top surface of the intermediate semiconductor device using chemical mechanical polishing.

3. The method of claim 1, wherein the hardmask covers an entirety of a top surface of each dielectric fin of the set of dielectric fins.

4. The method of claim 1, wherein the etching comprises exposure to dilute hydrofluoric acid.

5. The method of claim 4, wherein the etching and the removal of the hardmask occur simultaneously.

6. The method of claim 4, wherein the etching comprises a single exposure to the dilute hydrofluoric acid.

7. The method of claim 1, further comprising:

depositing a barrier layer on the inner surface of the trenches prior to the metallization.

8. The method of claim 1, wherein the dielectric matrix comprises one of SiCOH or pSiCOH.

9. The method of claim 1, wherein the metal comprises one of a group including: Cu, Co, and Ru.

10. The method of claim 1, wherein the damaging comprises exposing the inner surface of the trenches to a plasma.

11. The method of claim 10, wherein the exposure comprises remote plasma exposure or direct plasma exposure.

12. The method of claim 10, wherein the plasma comprises one of a group including: $NH_3$, $O_2$, and $CO_2$.

13. The method of claim 1, wherein the damaging comprises exposing the inner surface of the trenches to ozone.

14. The method of claim 1, wherein the damaging comprises exposing the inner surface of the trenches to a photolysis of a material via exposure to a broadband UV source and the material simultaneously.

15. The method of claim 14, wherein the material comprises one of a group including: $NH_3$, $O_2$, and $CO_2$.

16. A method comprising:

obtaining an intermediate semiconductor device having a substrate, a dielectric matrix, and a hardmask, the dielectric matrix including a set of trenches etched into the dielectric matrix and a set of dielectric fins comprising the dielectric matrix, wherein the set of trenches and the set of dielectric fins are of different widths;

damaging an inner surface of each trench of the set of trenches;

etching the damaged material of the trenches removing the damaged material of the dielectric matrix, widening each trench to a second width wider than before the damaging;

removing the hardmask; and metallizing the trenches by depositing a metal in the trenches directly on the dielectric matrix with no barrier between the metal and the dielectric matrix after the etching.

17. The method of claim 16, wherein the set of dielectric fins are wider than the set of trenches.

18. The method of claim 16, wherein the set of trenches is wider than the set of dielectric fins.

* * * * *